(12) United States Patent
Tay et al.

(10) Patent No.: US 8,421,198 B2
(45) Date of Patent: *Apr. 16, 2013

(54) INTEGRATED CIRCUIT PACKAGE SYSTEM WITH EXTERNAL INTERCONNECTS AT HIGH DENSITY

(75) Inventors: Lionel Chien Hui Tay, Singapore (SG); Zigmund Ramirez Camacho, Singapore (SG); Abelardo Hadap Advincula, Jr., Singapore (SG)

(73) Assignee: Stats Chippac Ltd., Singapore (SG)

( * ) Notice: Subject to any disclaimer, the term of this patent is extended or adjusted under 35 U.S.C. 154(b) by 321 days.

This patent is subject to a terminal disclaimer.

(21) Appl. No.: 11/856,841

(22) Filed: Sep. 18, 2007

(65) Prior Publication Data

US 2009/0072365 A1    Mar. 19, 2009

(51) Int. Cl.
*H01L 23/495* (2006.01)

(52) U.S. Cl.
USPC .... 257/676; 257/666; 257/677; 257/E23.031; 257/E23.052; 438/123

(58) Field of Classification Search .......... 257/677, 257/706, E21.499, E51.02, 666–676, E23.031, 257/E23.052; 361/690; 438/123
See application file for complete search history.

(56) References Cited

U.S. PATENT DOCUMENTS

| | | | | |
|---|---|---|---|---|
| 5,369,550 A * | 11/1994 | Kwon | ........................... | 361/690 |
| 6,034,423 A | 3/2000 | Mostafazadeh et al. | | |
| 6,118,174 A | 9/2000 | Kim | | |
| 6,335,564 B1 * | 1/2002 | Pour | ........................... | 257/666 |
| 6,707,135 B2 * | 3/2004 | Madrid | ........................ | 257/666 |
| 6,838,751 B2 | 1/2005 | Cheng et al. | | |
| 6,838,752 B2 * | 1/2005 | Diot | ............................. | 257/666 |
| 7,078,798 B2 | 7/2006 | Wang | | |
| 7,091,603 B2 * | 8/2006 | Mamitsu et al. | .............. | 257/706 |
| 7,109,572 B2 * | 9/2006 | Fee et al. | ...................... | 257/672 |
| 2004/0080030 A1 * | 4/2004 | Fee et al. | ...................... | 257/676 |
| 2009/0115040 A1 * | 5/2009 | Camacho et al. | ............. | 257/677 |

* cited by examiner

*Primary Examiner* — Eugene Lee
*Assistant Examiner* — Fang-Xing Jiang
(74) *Attorney, Agent, or Firm* — Ishimaru & Associates LLP

(57) ABSTRACT

An integrated circuit package system includes: connecting an integrated circuit die and external interconnects; forming an encapsulation over the integrated circuit die and a portion of the external interconnects; and forming an isolation hole between the external interconnects and into a side of the encapsulation exposing the external interconnects.

9 Claims, 4 Drawing Sheets

INTEGRATED CIRCUIT PACKAGE SYSTEM WITH EXTERNAL INTERCONNECTS AT HIGH DENSITY

TECHNICAL FIELD

The present invention relates generally to an integrated circuit package system and more particularly to an integrated circuit package system with external interconnects.

BACKGROUND ART

Increased miniaturization of components, greater packaging density of integrated circuits ("ICs"), higher performance, and lower cost are ongoing goals of the computer industry. As new generations of IC products are released, the number of devices used to fabricate them tends to decrease due to advances in technology. Simultaneously, the functionality of these products increases.

Semiconductor package structures continue to advance toward miniaturization and thinning to increase the density of the components that are packaged therein while decreasing the sizes of the products that are made therefrom. This is in response to continually increasing demands on information and communication apparatus for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook personal computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor die (or "chip") packages are of the type where a semiconductor die is molded into a package with a resin, such as an epoxy molding compound. The packages have a lead frame whose leads are projected from the package body, to provide a path for signal transfer between the die and external devices. Other conventional package configurations have contact terminals or pads formed directly on the surface of the package.

Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

An exemplary semiconductor package, well known in the electronics industry, is the quad flat nonleaded ("QFN") package. QFN packages typically include a lead frame, such as a conductive sheet stamped and etched, with a semiconductor die having a multitude of bond pads mounted to the top side of the lead frame. Wire bonds electrically connect the bond pads, of the semiconductor die, to a series of conductive lead fingers on the topside of the lead frame. Typically, the semiconductor die and the wire bonds are encapsulated within a molding compound.

In order to reduce manufacturing costs, the electronics industry is increasing the usage of QFN packages. In the manufacturing process, many obstacles must be overcome to deliver extremely small packages with thinner and thinner profile in high volume. Despite the trend towards miniaturization and thinner profile, more functions and more integrated circuits continue to be packed into QFN packages. Typical QFN solutions face problems providing the high density and high count I/O needed for modern electronic products.

Thus, a need still remains for an integrated circuit package system providing low cost manufacturing, improved yield, improved reliability, and high density I/O count. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

An integrated circuit package system includes: connecting an integrated circuit die and external interconnects; forming an encapsulation over the integrated circuit die and a portion of the external interconnects; and forming an isolation hole between the external interconnects and into a side of the encapsulation exposing the external interconnects.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
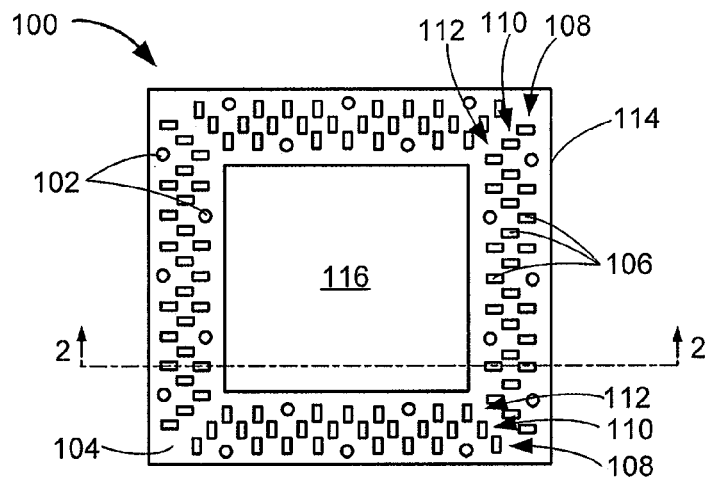
FIG. 1 is a bottom view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a bottom view of an integrated circuit package system 100 in a first embodiment of the present invention. The bottom view depicts isolation holes 102 within an encapsulation 104, such as epoxy mold compound. As an example, each of the isolation holes 102 electrically isolates external interconnects 106, such as terminal pads, adjacent to each of the isolation holes 102. In this example, each of the isolation holes 102 isolates the external interconnects 106 included in a first row 108, a second row 110, and a third row 112 of the external interconnects 106, wherein the external interconnects 106 are in a staggered configuration. The first row 108 is adjacent to a boundary 114 of the integrated circuit package system 100. The third row 112 is between the second row 110 and a die-attach paddle 116. The second row 110 is between the first row 108 and the third row 112.

For illustrative purposes, the integrated circuit package system 100 is shown as a quad flat non-leaded (QFN) package with the external interconnects 106 as terminal pads, although it is understood that the integrated circuit package system 100 may be a different type of package with different types of the external interconnects 106. For example, the integrated circuit package system 100 may be a quad flat package (QFP) type with the external interconnects 106 as leads extending from the encapsulation 104. Also for illustrative purposes, the integrated circuit package system 100 is shown with the die-attach paddle 116, although it is understood that the encapsulation 104 may not expose the die-attach paddle 116 or the integrated circuit package system 100 may not have the die-attach paddle 116.

Figure 2:
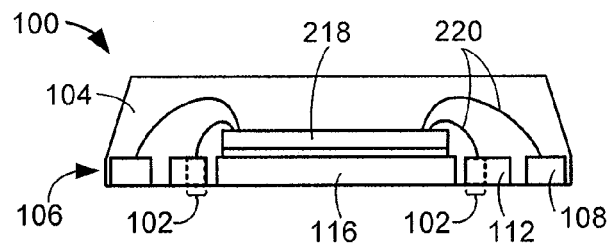
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The cross-sectional view depicts the isolation holes 102, which are shown behind the external interconnects 106 in this cross-sectional view, with dotted lines isolating different rows of the external interconnects 106. In this example, the isolation holes 102 separate the first row 108 and the third row 112 of the external interconnects 106.

An integrated circuit die 218 is over the die-attach paddle 116. Internal interconnects 220, such as bond wires or ribbon bond wires, connect the integrated circuit die 218 and the external interconnects 106. The encapsulation 104 covers the integrated circuit die 218 and partially covering the die-attach paddle 116 and the external interconnects 106. In this example, the external interconnects 106 and the die-attach paddle 116 are shown as coplanar.

Figure 3:
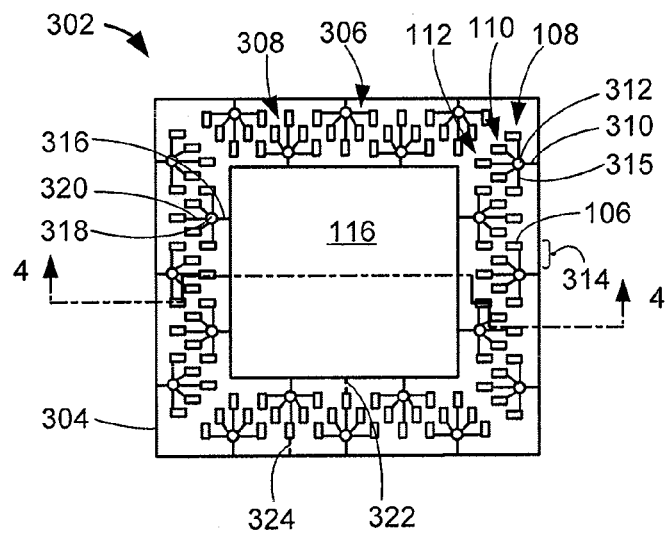
FIG. 3 is a bottom view of a portion of a lead frame in an intermediate step for manufacturing the integrated circuit package system of FIG. 1.

Referring now to FIG. 3, therein is a bottom view of a portion of a lead frame 302 in an intermediate step for manufacturing the integrated circuit package system 100 of FIG. 1. As an example, the lead frame 302 includes the die-attach paddle 116 surrounded by dam bars 304. First radiating structures 306 extend from the dam bars 304 towards the die-attach paddle 116. Second radiating structures 308 extend the die-attach paddle 116 towards the dam bars 304. The first radiating structures 306 and the second radiating structures 308 alternate in position along each of the dam bars 304 and are horizontally offset from the die-attach paddle 116 or the integrated circuit die 218.

Each of the first radiating structures 306 includes a first extension 310, a first common portion 312, and first radiating interconnects 314. The first extension 310 is between the dam bars 304 and the first common portion 312. The first radiating interconnects 314 extend radiating from the first common portion 312. There can be at least three of the first radiating interconnects 314 radiating or extending from the first common portion 312. The first radiating interconnects 314 can include the external interconnects 106 at an end of radiating tiebars 315 of the first radiating interconnects 314. An opposite end of each of radiating tiebars 315 of the first radiating interconnects 314 faces away from the external interconnects 106. The opposite end of each of the radiating tiebars 315 extends or radiates from the first common portion 312. The radiating tiebars 315 can connect the external interconnects 106 to the common portion 312. The first radiating interconnects 314 occupy the first row 108, the second row 110, and the third row 112.

Each of the second radiating structures 308 includes a second extension 316, a second common portion 318, and second radiating interconnects 320. The second extension 316 is between the die-attach paddle 116 and the second common portion 318. The second radiating interconnects 320 extend radiating from the second common portion 318. The second radiating interconnects 320 occupy the first row 108, the second row 110, and the third row 112.

As another example, the first radiating interconnects 314 may not be connected to the dam bars 304 with the first extension 310. A third extension 322, depicted as dotted lines, may connect the first radiating interconnects 314 with the die-attach paddle 116, wherein the third extension 322 attaches to one of the first radiating interconnects 314 adjacent to the die-attach paddle 116.

Yet another example, the second radiating interconnects 320 may not be connected to the die-attach paddle 116 with the second extension 316. A fourth extension 324, depicted as dotted lines, may connect the second radiating interconnects 320 with the dam bars 304, wherein the fourth extension 324 attaches to one of the second radiating interconnects 320 adjacent to the dam bars 304.

For illustrative purposes, the first radiating structures 306 is shown with the first radiating interconnects 314 extending to the first row 108, the second row 110, and the third row 112. Although it is understood that the first radiating structures 306 may have all of the first radiating interconnects 314 or have some of the rows or portions of the rows depopulated. Also for illustrative purposes, the second radiating structures 308 is shown with the second radiating interconnects 320 extending to the first row 108, the second row 110, and the third row 112. Although it is understood that the second radiating structures 308 may have all of the second radiating interconnects 320 or have some of the rows or portions of the rows depopulated.

Figure 4:
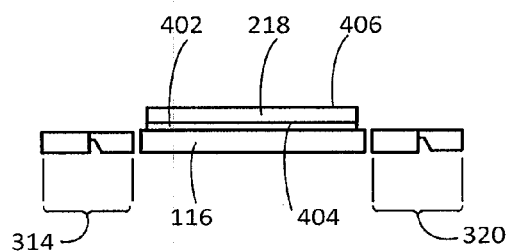
FIG. 4 is a cross-sectional view of the structure of FIG. 3 along a line 4-4.

Referring now to FIG. 4, therein is shown a cross-sectional view of the structure of FIG. 3 along a line 4-4. The integrated circuit die 218 mounts over the die-attach paddle 116 with an adhesive 402, such as a die-attach adhesive. The die-attach paddle 116 is between the first radiating interconnects 314 and the second radiating interconnects 320.

The integrated circuit die 218 includes a non-active side 404 and an active side 406, wherein the active side 406 includes active circuitry fabricated thereon. The non-active side 404 faces the die-attach paddle 116. For illustrative purposes, the integrated circuit die 218 is shown with the non-active side 404 facing the die-attach paddle 116, although it is understood that the active side 406 may face the die-attach paddle 116 without the adhesive 402. For example, the integrated circuit die 218 may be a flip chip mounted over the first radiating interconnects 314 and the second radiating interconnects 320.

Figure 5:
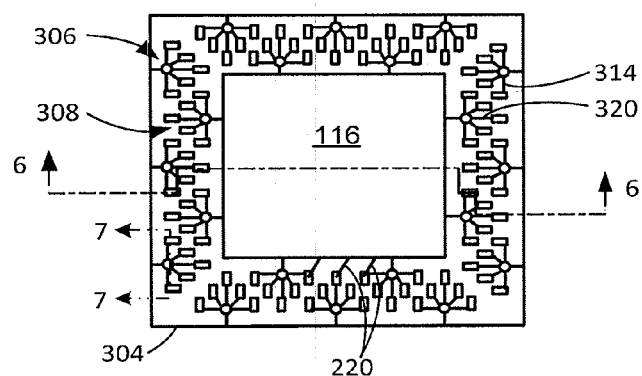
FIG. 5 is a bottom view of the structure of FIG. 3 in a connecting step.

Referring now to FIG. 5, therein is shown a bottom view of the structure of FIG. 3 in a connecting step. The bottom view depicts the first radiating structures 306 extending from the dam bars 304 and the second radiating structures 308 extending from the die-attach paddle 116. The internal interconnects 220 are shown emerging from the other side of the die-attach paddle 116 to the first radiating interconnects 314 and the second radiating interconnects 320. For clarity, not all the internal interconnects 220 are shown.

Figure 6:
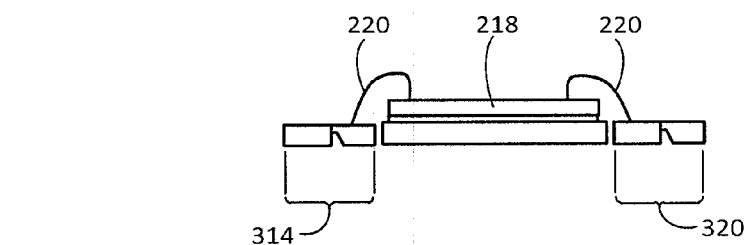
FIG. 6 is a cross-sectional view of the structure of FIG. 5 along a line 6-6.

Referring now to FIG. 6, therein is shown a cross-sectional view of the structure of FIG. 5 along a line 6-6. The internal interconnects 220 connect the integrated circuit die 218 and the first radiating interconnects 314. The internal interconnects 220 also connect the integrated circuit die 218 and the second radiating interconnects 320.

Figures 7A, 7B:
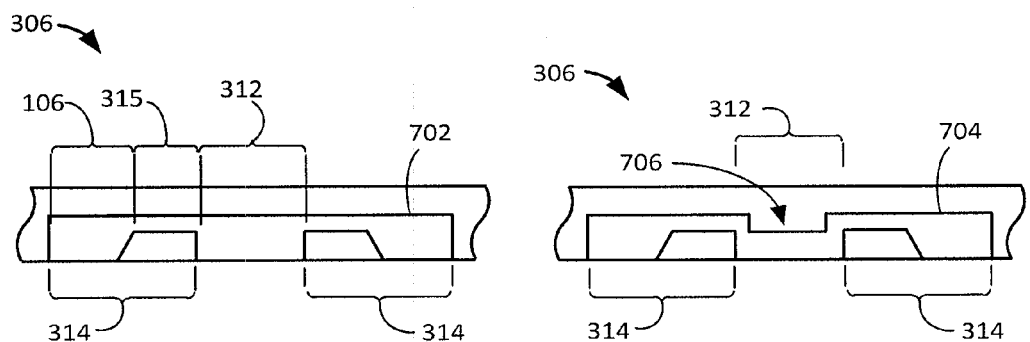
FIG. 7A and 7B are exemplary cross-sectional views of the structure of FIG. 5 along the section line 7-7.

Referring now to FIG. 7A and 7B, therein are shown exemplary cross-sectional views of the structure of FIG. 5 along the section line 7-7. The exemplary cross-sectional view depicts, as an example, one of the first radiating structures 306. The first common portion 312 is between the first radiating interconnects 314. The first radiating structures 306 are depicted in this example, but the more detailed cross-sectional view may have represented the second radiating structures 308 of FIG. 3.

Shown in FIG. 7A, a first side 702 of the first radiating structures 306 is planar such that the first common portion 312 and the first radiating interconnects 314 are coplanar along the first side 702. Shown in FIG. 7B, as an example, a second side 704 of the first radiating structures 306 includes an indent 706 approximately at the first common portion 312. The second side 704 in FIG. 7B is at the same relative side as the first side 702 in FIG. 7A.

Figure 8:
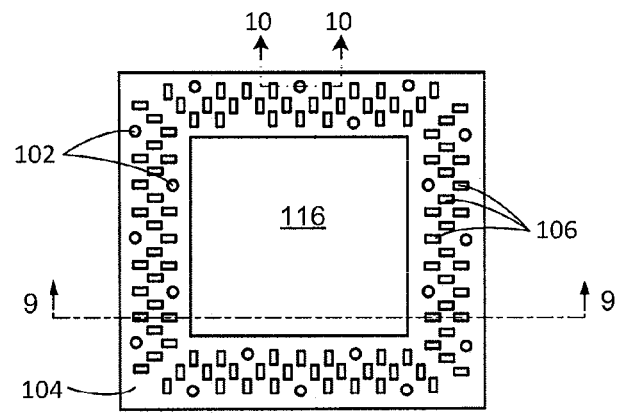
FIG. 8 is a bottom view of the structure of FIG. 5 in an isolating step.

Referring now to FIG. 8, therein is shown a bottom view of the structure of FIG. 5 in an isolating step. The structure of FIG. 5 undergoes a molding process forming the encapsulation 104. The encapsulation 104 exposes the die-attach paddle 116 and the ends of both the first radiating interconnects 314 of FIG. 5 and the second radiating interconnects 320 of FIG. 5.

The first radiating interconnects 314 may be isolated from each other by forming the isolation holes 102 through the encapsulation 104 by severing the physical connection of the first radiating interconnects 314 at the first common portion 312 of FIG. 3 exposing a portion of the radiating tiebars 315 of the first radiating interconnects 314 in the isolation holes 102 and isolating the external interconnects 106. The isolation holes 102 may be formed in a number of ways. For example, the isolation holes 102 may be formed with chemical etching with a stencil (not shown), drilling, or lasing. The second radiating interconnects 320 may also be isolated from each other by forming the isolation holes through the encapsulation 104 and severing the physical connection at the second common portion 318 of FIG. 3 forming the remaining portion of the external interconnects 106.

For illustrative purposes, the isolation holes 102 are shown over all the first radiating structures 306 of FIG. 5 and the second radiating structures 308 of FIG. 5, although it is understood that the isolation holes 102 may be formed to a portion of the first radiating structures 306 and the second radiating structures 308. The placement selectivity of the isolation holes 102 may provide more degrees of freedom for connection with the next system level (not shown), such as a printed circuit board or another integrated circuit package system.

Also for illustrative purposes, the isolation holes 102 are shown over the first common portion 312 and the second common portion 318, although it is understood that the isolation holes 102 may be formed at the ends of the first radiating interconnects 314 and the second radiating interconnects 320. The additional placement selectivity of the isolation holes 102 may also provide more degrees of freedom for connection with the next system level by depopulating selected sites of the external interconnects 106.

Figure 9:
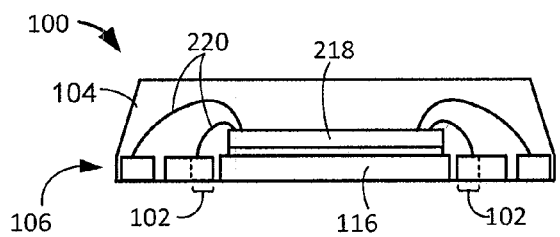
FIG. 9 is a cross-sectional view of the structure of FIG. 8 along a line 9-9.

Referring now to FIG. 9, therein is shown a cross-sectional view of the structure of FIG. 8 along a line 9-9. The cross-sectional view depicts the isolation holes 102 with dotted lines between the rows of the external interconnects 106. The integrated circuit die 218 mounts over the die-attach paddle 116. The internal interconnects 220 connect the integrated circuit die 218 and the external interconnects 106. The encapsulation 104 covers the internal interconnects 220 and the integrated circuit die 218 over the die-attach paddle 116 and the external interconnects 106. The encapsulation 104 partially exposes the external interconnects 106 and the die-attach paddle 116.

The structure having the encapsulation 104 and the isolation holes 102 may undergo other end of line processing, such as cleaning. The lead frame 302 of FIG. 3 is singulated forming the integrated circuit package system 100.

It has been discovered that the present invention provides low cost and reliable method and structure for high density I/O integrated circuit package systems manufactured from lead frames. The radiating structures having the radiating interconnects fanning out from the common portion allows to pack more I/O without being restricted by diagonal tie bars found in conventional lead frames. The radiating structures may be attached to both the dam bars and the die-attach paddle eliminating the need for tie bars to support the die-attach paddle and allowing for further increase in I/O count. Selective formation of the isolation holes allows flexibility to depopulate predetermined sites of the external interconnects or leave predetermined sites of the external interconnects 106 electrically connected by the common portion.

Figures 10A, 10B:
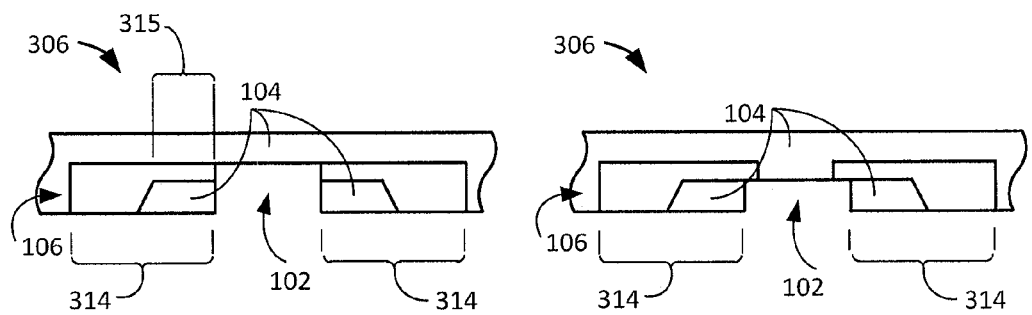
FIG. 10A and 10B are exemplary cross-sectional views of the structure of FIG. 8 along the section line 10-10.

Referring now to FIGS. 10A and 10B, therein are shown exemplary cross-sectional views of the structure of FIG. 8 along the section line 10-10. The exemplary cross-sectional view depicts, as an example, one of the first radiating structures 306 of FIG. 3. Shown in FIG. 10A, the first common portion 312 of FIG. 7A has been removed between the first radiating interconnects 314 of FIG. 7A leaving one of the isolation holes 102 between the external interconnects 106. Similarly shown in FIG. 10B, the first common portion 312 of FIG. 7B has been removed between the first radiating interconnects 314 of FIG. 7B leaving one of the isolation holes 102 between the external interconnects 106. In FIG. 10B, the isolation holes 102 do not traverse the height of the external interconnects 106 such that the encapsulation 104 is also between the external interconnects 106. The first radiating structures 306 are depicted in this example, but the more detailed cross-sectional view may have represented the second radiating structures 308 of FIG. 3.

Figure 11:
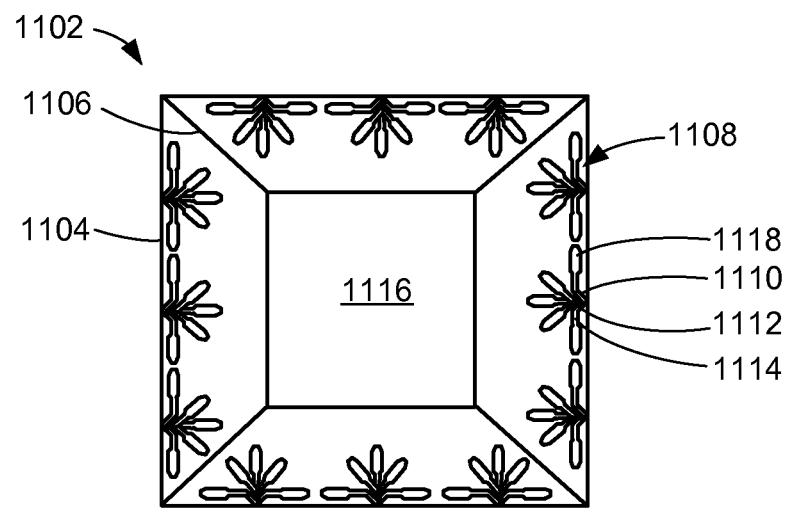
FIG. 11 is a bottom view of a lead frame in a second embodiment of the present invention.

Referring now to FIG. 11, therein is shown a bottom view of a lead frame 1102 in a second embodiment of the present invention. The lead frame 1102 may be used for forming an embodiment of the integrated circuit package system 100 of FIG. 1. As an example, the lead frame 1102 includes a die-attach paddle 1116 surrounded by dam bars 1104. Tie bars 1106 are between the corners of the dam bars 1104 and corners of the die-attach paddle 1116.

Radiating structures 1108 extend from the dam bars 1104 towards the die-attach paddle 1116. Each of the radiating structures 1108 includes an extension 1110, a common portion 1112, and radiating interconnects 1114. The extension 1110 is between the dam bars 1104 and the common portion 1112. The radiating interconnects 1114 extend radiating from the common portion 1112. Terminal pads 1118 at the ends of the radiating interconnects 1114 are formed in a configuration such that the terminal pads 1118 radiate out from the common portion 1112.

The number and angles of the radiating interconnects 1114 may vary. The length of the extension 1110 and the radiating interconnects 1114 may vary. The size of the die-attach paddle 1116 may vary. The configuration of the terminal pads 1118 may vary, such as parallel to the borders of the integrated circuit package system 100, as an example, or may be formed in a round configuration. The exposed shape and size of the terminal pads 1118 may vary.

Figure 12:
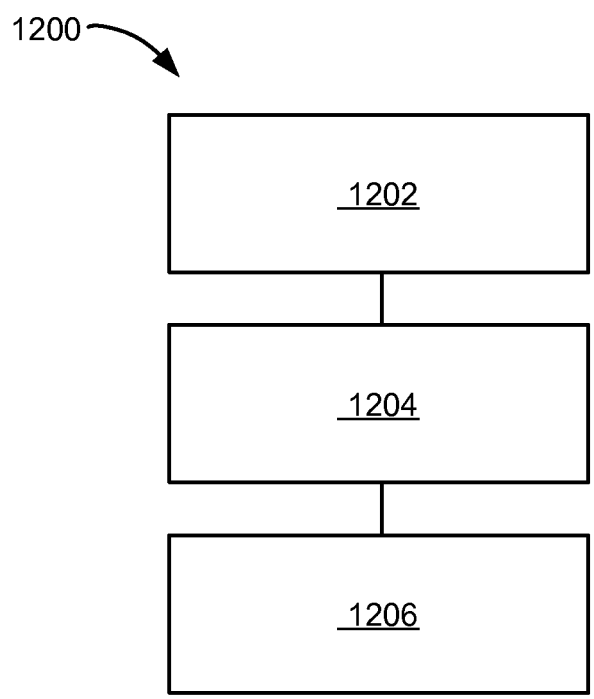
FIG. 12 is a flow chart of an integrated circuit package system for manufacturing of the integrated circuit package system in an embodiment of the present invention.

Referring now to FIG. 12, therein is shown a flow chart of an integrated circuit package system 1200 for manufacturing the integrated circuit package system 100 in an embodiment of the present invention. The system 1200 includes connecting an integrated circuit die and external interconnects in a block 1202; forming an encapsulation over the integrated circuit die and a portion of the external interconnects in a block 1204; and forming an isolation hole between the external interconnects and into a side of the encapsulation exposing the external interconnects in a block 1206.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of integrated circuit package system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system comprising:
a die-attach paddle;
an integrated circuit die over the die-attach paddle;
at least one radiating structure having at least three radiating interconnects; and
an encapsulation having an isolation hole horizontally offset from the die-attach paddle and over the integrated circuit die and the radiating structure; and
wherein:
each of the three radiating interconnects includes:
a radiating tiebar,
an external interconnect connected to an end of the radiating tiebar and electrically to the integrated circuit die, and
a portion of an opposite end of each of the radiating tiebars, facing away from the external interconnect, having an orientation characteristic of extending from the isolation hole, and exposed by the isolation hole isolating the external interconnects from each other.

2. The system as claimed in claim 1 wherein the external interconnects are in a radiating configuration from the isolation hole.

3. The system as claimed in claim 1 wherein the encapsulation is between the external interconnects and over the isolation hole.

4. The system as claimed in claim 1 wherein the external interconnects are parallel to borders of the encapsulation.

5. The system as claimed in claim 1 wherein the encapsulation is over a portion of the die-attach paddle.

6. The system as claimed in claim 5 wherein the isolation hole is adjacent to a boundary of the encapsulation.

7. The system as claimed in claim 5 wherein the isolation hole is adjacent to the die-attach paddle.

8. The system as claimed in claim 5 wherein the external interconnects connected with the integrated circuit die includes multiple rows of the external interconnects in a staggered configuration connected with the integrated circuit die.

9. The system as claimed in claim 5 wherein the die-attach paddle is exposed from the encapsulation.

* * * * *